US012040130B2

(12) United States Patent
Nomura et al.

(10) Patent No.: US 12,040,130 B2
(45) Date of Patent: Jul. 16, 2024

(54) SUPERCONDUCTING COIL AND MANUFACTURING METHOD FOR SUPERCONDUCTING COIL

(71) Applicant: Canon Medical Systems Corporation, Tochigi (JP)

(72) Inventors: Kota Nomura, Tokyo (JP); Shoichi Yokoyama, Tokyo (JP); Tetsuya Matsuda, Tokyo (JP)

(73) Assignee: CANON MEDICAL SYSTEMS CORPORATION, Tochigi (JP)

( * ) Notice: Subject to any disclaimer, the term of this patent is extended or adjusted under 35 U.S.C. 154(b) by 184 days.

(21) Appl. No.: 17/790,146

(22) PCT Filed: Jan. 21, 2020

(86) PCT No.: PCT/JP2020/001947
§ 371 (c)(1),
(2) Date: Jun. 30, 2022

(87) PCT Pub. No.: WO2021/149156
PCT Pub. Date: Jul. 29, 2021

(65) Prior Publication Data
US 2023/0036637 A1 Feb. 2, 2023

(51) Int. Cl.
*H01F 6/06* (2006.01)
*G01R 33/3815* (2006.01)
(Continued)

(52) U.S. Cl.
CPC ............ *H01F 6/06* (2013.01); *G01R 33/3815* (2013.01); *H01F 41/048* (2013.01); *H01F 41/122* (2013.01)

(58) Field of Classification Search
CPC ........ H01F 6/06; H01F 41/048; H01F 41/066; H01F 41/073; H01F 41/082; H01F 41/098
See application file for complete search history.

(56) References Cited

U.S. PATENT DOCUMENTS 4,935,714 A * 6/1990 Vermilyea .......... G01R 33/3815
324/318
4,969,064 A * 11/1990 Shadowitz .............. H01F 6/006
335/216
(Continued)

FOREIGN PATENT DOCUMENTS

JP 63088809 A * 4/1988
JP 01071105 A * 3/1989
(Continued)

OTHER PUBLICATIONS

International Search Report and Written Opinion dated Mar. 10, 2020, received for PCT Application PCT/JP2020/001947, filed on Jan. 21, 2020, 8 pages including English Translation.

*Primary Examiner* — Ramon M Barrera
(74) *Attorney, Agent, or Firm* — XSENSUS LLP (57) ABSTRACT

In a superconducting coil used in an MRI apparatus, it is necessary to arrange a superconducting wire at a desired position to obtain a desired coil shape in order to obtain a temporally stable static electromagnetic field with high strength and high uniformity. A superconducting coil includes a winding frame, a spacer disposed on an outer periphery of winding frame and including a winding groove having a spiral shape and a communication groove provided between winding grooves, and includes a coil group having a superconducting wire wound in winding groove. It is therefore possible to obtain superconducting coil having a desired coil shape.

10 Claims, 4 Drawing Sheets

(51) Int. Cl.
*H01F 41/04* (2006.01)
*H01F 41/12* (2006.01)

(56) References Cited

U.S. PATENT DOCUMENTS 5,416,415 A     5/1995  Dorri et al.
8,151,443 B2 *  4/2012  Hobbs ................ G01R 33/3815
                                                  324/309

FOREIGN PATENT DOCUMENTS

| JP | 8-168476 A | 7/1996 |
| JP | 2008-85375 A | 4/2008 |
| JP | 4762225 B2 | 8/2011 |

* cited by examiner

SUPERCONDUCTING COIL AND MANUFACTURING METHOD FOR SUPERCONDUCTING COIL

CROSS-REFERENCE TO RELATED APPLICATION

The present application is based on PCT filing PCT/JP2020/001947, filed Jan. 21, 2020, the entire contents of which are incorporated herein by reference.

TECHNICAL FIELD

The present disclosure relates to a superconducting coil used in a magnetic resonance imaging (MRI) apparatus (hereinafter, referred to as an MRI apparatus) and a manufacturing method for the superconducting coil.

BACKGROUND ART

It is known that by using a superconducting coil as a static electromagnetic field generation source of an MRI apparatus, a temporally stable static electromagnetic field with high strength and high uniformity can be obtained.

In order to capture a precise human body tomographic image with high contrast, a superconducting coil used in an MRI apparatus is required to have a magnetic field intensity of about 0.5 Tesla to 3 Tesla and a temporally stable static magnetic field characteristic of about 0.05 ppm/h with a magnetic field uniformity of about 1 ppm to 10 ppm in a spherical space having a diameter of about 30 cm to 45 cm from a magnetic field center.

With advancing development of a superconducting coil satisfying the above conditions, it has been considered to wind, around an imaging space, a superconducting wire in a desired coil shape for obtaining the above characteristics. For example, a method of winding a superconducting wire around a winding frame while inserting a member that adjusts a shape has been disclosed (see, for example, PTL 1).

CITATION LIST

Patent Literature

PTL 1: Japanese Patent Laying-Open No. 2008-85375

SUMMARY OF INVENTION

Technical Problem

However, in the conventional method, when the superconducting wire is laminated and wound, it is difficult to arrange the superconducting wire at a desired position and provide a winding space, and thus there is a problem that a desired coil shape cannot be obtained.

The present disclosure has been made to solve the above problem, and an object of the present disclosure is to provide a superconducting coil having a coil group whose coil shape is a desired shape.

Solution to Problem

A superconducting coil of the present disclosure includes a winding frame, a first spacer disposed on an outer periphery of the winding frame and including a first winding groove having a spiral shape and disposed in a peripheral direction of the winding frame, a second winding groove having a spiral shape and disposed apart from the first winding groove, and a first communication groove provided between the first winding groove and the second winding groove, a second spacer disposed on an upper layer of the first spacer and including a third winding groove having a spiral shape and disposed above the first winding groove, a fourth winding groove having a spiral shape and disposed apart from the third winding groove and above the second winding groove, and a second communication groove provided between the third winding groove and the fourth winding groove, a first coil group including a first layer of a superconducting wire having the superconducting wire wound in the first winding groove, and a second layer of the superconducting wire having the superconducting wire wound in the third winding groove, and a second coil group communicated with the first coil group by the superconducting wire on the first communication groove and the second communication groove and including a first layer of the superconducting wire having the superconducting wire wound in the second winding groove, and a second layer of the superconducting wire having the superconducting wire wound in the fourth winding groove.

A manufacturing method for a superconducting coil of the present disclosure includes a first spacer arrangement step of arranging, on an outer periphery of a winding frame, a first spacer including a first winding groove having a spiral shape and disposed on the outer periphery of the winding fame, a second winding groove having a spiral shape and disposed apart from the first winding groove, and a first communication groove to communicate the first winding groove with the second winding groove, a first layer formation step of forming a first layer of a first coil group by winding a superconducting wire in the first winding groove and forming a first layer of a second coil group by winding the superconducting wire in the first communication groove and the second winding groove, a second spacer arrangement step of arranging, on the first spacer, a second spacer including a third winding groove disposed on the first spacer and having a spiral shape, a fourth winding groove disposed apart from the third winding groove and having a spiral shape, and a second communication groove to communicate the third winding groove with the fourth winding groove such that the third winding groove is disposed above the first winding groove, and the fourth winding groove is disposed above the second winding groove, and a second layer formation step of forming a second layer of the second coil group by winding the superconducting wire in the fourth winding groove and forming a second layer of the first coil group by winding the superconducting wire in the second communication groove and the third winding groove.

Advantageous Effects of Invention

The present disclosure makes it possible to obtain a superconducting coil having a coil group whose coil shape is a desired shape.

DESCRIPTION OF EMBODIMENTS

Hereinafter, embodiments will be described with reference to the drawings.

First Embodiment

Figure 1:
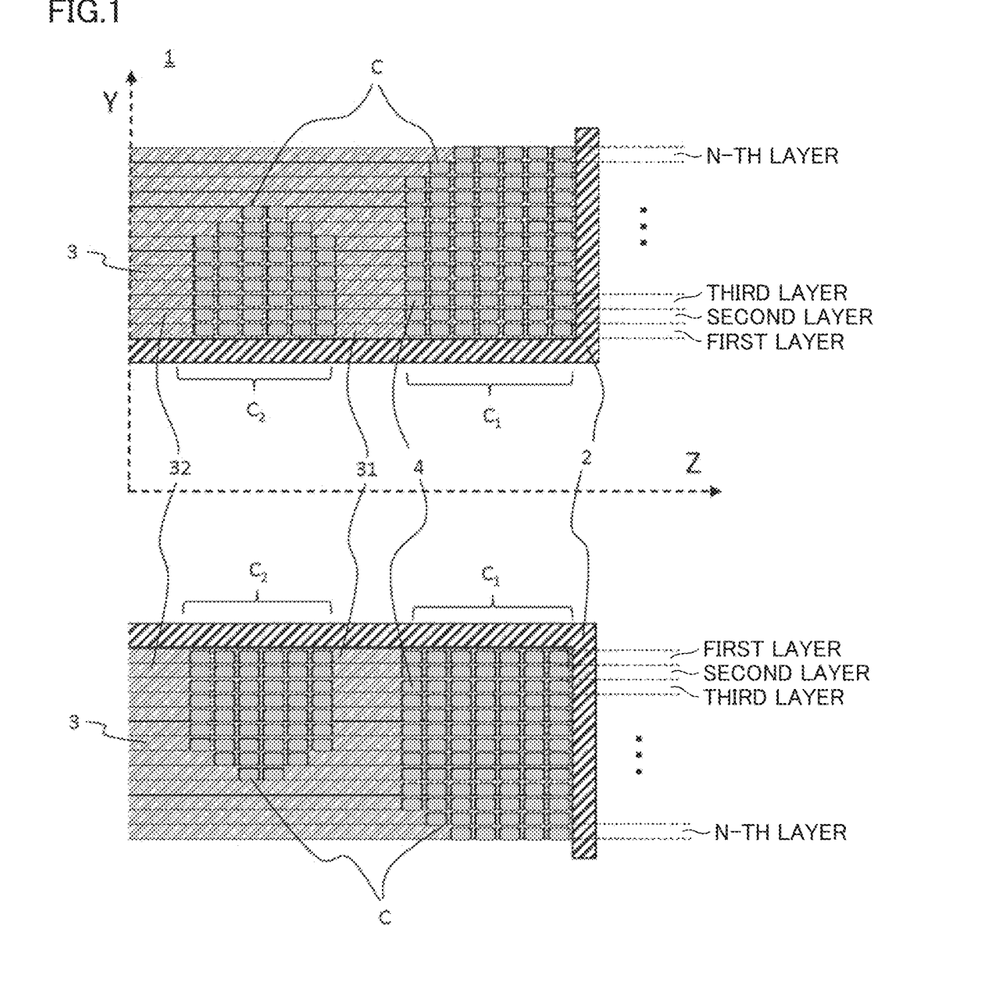
FIG. 1 is a schematic sectional view illustrating a part of a superconducting coil according to a first embodiment.

FIG. 1 is a schematic sectional view illustrating a part of a superconducting coil 1 according to a first embodiment. Superconducting coil 1 is used in, for example, a solenoid MRI apparatus. Superconducting coil 1 is provided in a substantially cylindrical vacuum heat insulation container (not shown), and is immersed in liquid helium or the like to have a low temperature. Superconducting coil 1 includes a spacer 3 disposed on an outer periphery of a winding frame 2 disposed on an inner wall of the vacuum heat insulation container and provided with a winding groove 5 and a communication groove 6, and includes a coil group C formed by a superconducting wire 4 being wound in winding groove 5, with a center of winding frame 2 as a rotation axis (Z axis in FIG. 1).

Winding frame 2 includes, for example, metal, fiber-reinforced plastic, or the like, has a cylindrical shape, and is disposed in the vacuum heat insulation container. Here, the cylindrical shape includes a non-concentric shape, and may be any shape as long as winding frame 2 can be disposed in the vacuum heat insulation container.

Spacer 3 has a sheet shape and includes, for example, glass epoxy, and a plurality of layers of sheets are disposed on the outer periphery of winding frame 2. Spacer 3 having a sheet shape is disposed on winding frame 2 and has, for example, a cylindrical shape in accordance with an outer shape of winding frame 2. Spacer 3 is provided with winding groove 5 and communication groove 6, and superconducting wire 4 is wound in these grooves to form coil group C having an annular shape.

A plurality of coil groups C are provided on winding frame 2. The number of coil groups C varies depending on coil design, and thus may be a desired number. Each coil group C includes a plurality of folded superconducting wires 4. Similarly to the number of coil groups, the number of layers varies depending on the coil design, and thus each coil group C may be constituted by a desired number of layers of superconducting wire 4. Hereinafter, for ease of description, coil group C on the right side in FIG. 1 is referred to as a first coil group $C_1$, and coil group C on the left side in FIG. 1 is referred to as a second coil group $C_2$.

Figure 2:
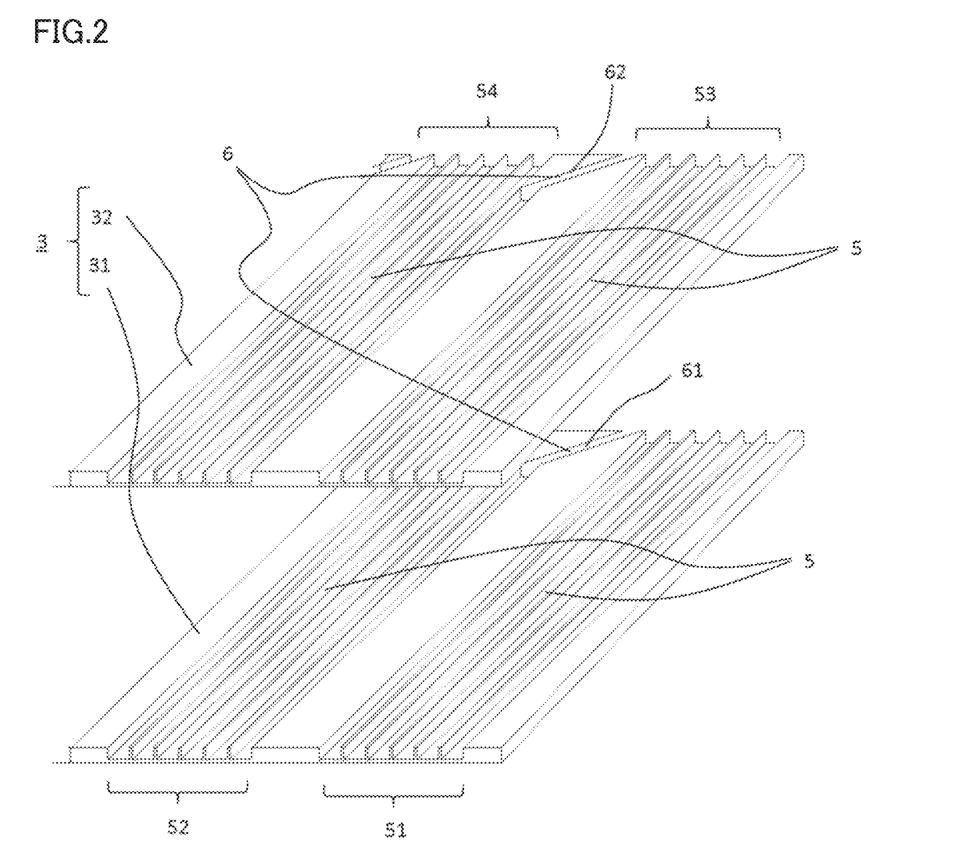
FIG. 2 is a perspective view illustrating a part of a spacer according to the first embodiment.

FIG. 2 is a schematic perspective view illustrating a part of spacer 3. FIG. 2 illustrates, in an upper part, a first spacer 31 in which first layers of first coil group $C_1$ and second coil group $C_2$ are formed, and, in a lower part, a second spacer 32 in which second layers of first coil group $C_1$ and second coil group $C_2$ are formed. Winding groove 5 is a groove in which superconducting wire 4 having a diameter of about 2 mm obtained by coating, for example, Nb—Ti with Cu and an insulating material is disposed, and winding groove 5 is spirally continuous when spacer 3 is disposed in winding frame 2. The groove has a width and a depth of, for example, about 2 mm, and is formed such that superconducting wire 4 can be disposed in the groove. Here, a direction in which winding groove 5 is formed, that is, a direction in which superconducting wire 4 is wound is referred to as a peripheral direction.

Hereinafter, in FIG. 2, winding groove 5 formed on the right side of first spacer 31 is referred to as a first winding groove 51, winding groove 5 formed on the left side of first spacer 31 is referred to as a second winding groove 52, winding groove 5 formed on the right side of second spacer 32 is referred to as a third winding groove 53, and winding groove 5 formed on the left side of second spacer 32 is referred to as a fourth winding groove 54. First winding groove 51, second winding groove 52, third winding groove 53, and fourth winding groove 54 are provided with a space therebetween. Then, the first layer of coil group C is formed by winding superconducting wire 4 in first winding groove 51 and second winding groove 52, and the second layer of coil group C is formed by winding superconducting wire 4 in third winding groove 53 and fourth winding groove 54.

Spacer 3 is provided with communication groove 6. In an example in FIG. 2, communication groove 6 is provided between first winding groove 51 and second winding groove 52, and between third winding groove 53 and fourth winding groove 54, and superconducting wire 4 is disposed. Superconducting wire 4 disposed in communication groove 6 communicates with coil group C. For example, in a case where superconducting wire 4 is wound in a direction from first coil group $C_1$ toward second coil group $C_2$ in a single layer, an end point of first coil group $C_1$ and a start point of second coil group $C_2$ are communicated by superconducting wire 4. Communication groove 6 provided in first spacer 31 is referred to as a first communication groove 61, and communication groove 6 provided in second spacer 32 is referred to as a second communication groove 62.

In this manner, a single layer of coil group C is formed on one spacer 3, and the single layer is laminated to form a plurality of layers of the plurality of coil groups C.

Superconducting coil 1 in which first coil group $C_1$ and second coil group $C_2$ are formed will be described with reference to FIGS. 1 and 2. First spacer 31 includes a first winding groove 51 and a second winding groove 52 which are disposed apart from each other so as to be spirally continuous, and first winding groove 51 and second winding groove 52 are communicated by first communication groove 61. The first layer of first coil group $C_1$ is formed in first winding groove 51, and the first layer of second coil group $C_2$ is formed in second winding groove 52. By arranging superconducting wire 4 on first communication groove 61, the first layer of first coil group $C_1$ and the first layer of second coil group $C_2$ are communicated by continuous superconducting wire 4.

Second spacer 32 is provided on first spacer 31, and the second layers of first coil group $C_1$ and second coil group $C_2$ are formed on second spacer 32. Second spacer 32 includes third winding groove 53 disposed on first winding groove 51 and fourth winding groove 54 disposed on second winding groove 52. Third winding groove 53 and fourth winding groove 54 are formed so as to be spirally continuous. Second communication groove 62 is provided between third winding groove 53 and fourth winding groove 54 to communicate these winding grooves with each other. Similarly to the first layers of first coil group $C_1$ and second coil group $C_2$, superconducting wire 4 is wound in third winding groove 53 to form the second layer of first coil group $C_1$, and superconducting wire 4 is wound in fourth winding groove 54 to form the second layer of second coil group $C_2$.

By arranging superconducting wire 4 on second communication groove 62, the second layer of first coil group $C_1$ and the second layer of second coil group $C_2$ are communicated by continuous superconducting wire 4. The same applies to a case of increasing coil groups C including, for example, a third coil group $C_3$ and a fourth coil group $C_4$. In this case, in the same layer, each coil group C is communicated with adjacent coil group C by adjacent communication groove 6.

Here, since superconducting wire 4 is folded back between the first layer and the second layer of coil group C, superconducting wire 4 constituting the first layer and the second layer is continuous. The direction in which superconducting wire 4 is wound is opposite between the first layer and the second layer.

As described above, by repeatedly winding superconducting wire 4 in winding groove 5 of spacer 3 and arranging spacer 3 for each layer, the plurality of coil groups C can be formed, and the coil shape of coil group C can be made as desired.

For example, in order to obtain a non-rectangular coil sectional shape, spacer 3 only needs to be designed such that the number of turns of coil group C decreases toward an upper layer, that is, the number of grooves constituting winding groove 5 in sectional view (in a view of FIG. 1 from the front side of the sheet) decreases toward the upper layer. In this design, the cross section of coil group C can be a non-rectangular shape whose width decreases toward outside. In a design of spacer 3 in which the number of turns of coil group C decreases toward a lower layer, that is, the number of grooves constituting winding groove 5 in sectional view decreases toward the lower layer, the cross section of coil group C can be a non-rectangular shape whose width of the cross section decreases toward inside.

Figure 3:
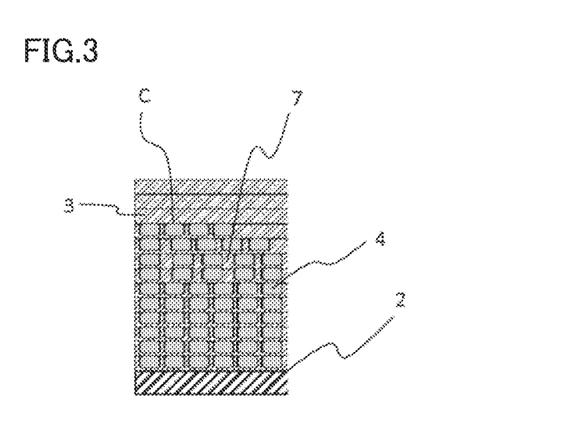
FIG. 3 is a schematic sectional view illustrating an example of a coil shape according to the first embodiment.

In spacer 3, by varying distances between the grooves constituting winding groove 5, superconducting wire 4 can be disposed discretely. For example, by forming a part in which distances between some of the grooves are larger in winding groove 5, it is possible to form a coil sectional shape in which a space 7 is provided by the distances between the grooves of winding groove 5 as in coil group C illustrated in FIG. 3, and superconducting wire 4 can be disposed discretely.

As described above, by arranging spacer 3 provided with winding groove 5 in which superconducting wire 4 is wound and communication groove 6 communicating with winding groove 5 on the outer periphery of winding frame 2, and by designing the number of grooves of winding groove 5 and the distances between the grooves appropriately, the coil sectional shape can be made as desired.

Next, description will be made of a manufacturing method for superconducting coil 1 according to the present embodiment.

First, first winding groove 51 having a spiral shape, second winding groove 52 disposed apart from first winding groove 51 and having a spiral shape, and first communication groove 61 communicating first winding groove 51 with second winding groove 52 are provided on an insulating sheet of glass epoxy or the like to form first spacer 31. Here, a thickness from a bottom surface of first spacer 31 to a bottom surface of winding groove 5 and a bottom surface of communication groove 6 is, for example, less than or equal to 1 mm, and depths and widths of winding groove 5 and communication groove 6 are, for example, about 2 mm.

Next, similarly to first spacer 31, third winding groove 53 having a spiral shape, fourth winding groove 54 disposed apart from third winding groove 53 and having a spiral shape, and second communication groove 62 communicating third winding groove 53 with fourth winding groove 54 are provided on an insulating sheet to form second spacer 32. Similarly to first spacer 31 and second spacer 32, a plurality of spacers 3 having communication groove 6 communicating winding groove 5 with adjacent winding groove 5 are formed.

Then, first spacer 31 is disposed on the outer periphery of winding frame 2 (first spacer arrangement step).

The following will be description of a step of winding superconducting wire 4 in first winding groove 51 and second winding groove 52 to form the first layers of first coil group $C_1$ and second coil group $C_2$ (first layer formation step).

First, superconducting wire 4 is wound in first winding groove 51 to form the first layer of first coil group $C_1$. Next, with the center of winding frame 2 as the rotation axis, superconducting wire 4 is wound in first communication groove 61 to communicate first coil group $C_1$ with second coil group $C_2$ in the first layer by continuous superconducting wire 4 (coil group communication step), and superconducting wire 4 is wound in second winding groove 52 to form the first layer of second coil group $C_2$. In this way, the first layers of first coil group $C_1$ and second coil group $C_2$ are formed. In a case where three or more coil groups C are formed in first spacer 31, adjacent winding grooves 5 are similarly communicated with each other by first communication groove 61 to form the first layer of each coil group C.

Then, second spacer 32 is provided on first spacer 31 in which the first layers of first coil group $C_1$ and second coil group $C_2$ are formed (second spacer arrangement step). In the second spacer arrangement step, third winding groove 53 is disposed on first winding groove 51 of first spacer 31, and fourth winding groove 54 is disposed on second winding groove 52 of first spacer 31.

The following will be description of a step of winding superconducting wire 4 in third winding groove 53 and fourth winding groove 54 to form the second layers of first coil group $C_1$ and second coil group $C_2$ (second layer formation step).

First, superconducting wire 4 constituting the first layer of second coil group $C_2$ is extended to fourth winding groove 54 of second spacer 32. In a case where three or more coil groups C are formed, superconducting wire 4 only needs to be extended from the end point of the first layer to the start point of the second layer.

First, superconducting wire 4 is wound in fourth winding groove 54 to form the second layer of second coil group $C_2$. Next, superconducting wire 4 is wound in second communication groove 62 to communicate second coil group $C_2$ with first coil group $C_1$ in the second layer by continuous superconducting wire 4, and superconducting wire 4 is wound in third winding groove 53 to form the second layer of first coil group $C_1$. In this way, the second layers of first coil group $C_1$ and second coil group $C_2$ are formed. In a case where three or more coil groups C are formed in second spacer 32, adjacent winding grooves 5 only needs to be similarly communicated with each other by second communication groove 62 to form the second layer of each coil group C.

Further, a step of arranging one spacer 3, a step of forming single layers of first coil group $C_1$ and second coil group $C_2$, and a step of extending superconducting wire 4 to the upper layer are repeated until a desired number (N) of layers is obtained to obtain superconducting coil 1. Here, N is an integer greater than 1.

That is, spacer 3 having a plurality of winding grooves 5 and communication groove 6 communicating adjacent winding grooves 5 with each other is disposed on the outer periphery of winding frame 2, and superconducting wire 4 is wound in winding grooves 5 and communication groove 6 to form a single layer of continuous coil group C. Next, spacer 3 is disposed in the upper layer of the single layer of coil group C thus formed, and superconducting wire 4 constituting coil group C of the lower layer is extended to spacer 3 in the upper layer. Thereafter, superconducting wire 4 is wound in winding groove 5 and communication groove 6 in the upper layer to form a single layer of continuous coil group C and obtain coil group C including a plurality of layers.

As described above, by repeatedly arranging spacer 3 for each layer, the plurality of coil groups C can be formed, and the coil shape of coil group C can be made as desired. Superconducting wire 4 does not need to be folded back for each layer of one coil group C of superconducting wire 4, the plurality of coil groups C can be continuously wound in a single layer without being folded back, and production efficiency of superconducting coil 1 is improved. In addition, since superconducting wire 4 is wound in winding groove 5, superconducting wire 4 can be accurately wound.

In the present embodiment, an example has been described in which glass epoxy is used as a material of spacer 3, but for example, a prepreg sheet in which reinforcing fibers such as aramid fibers are impregnated with an epoxy resin may be used. In this case, after the prepreg sheet is grooved, spacer 3 is heated to about 80° C. to be softened when spacer 3 is disposed on the outer periphery of winding frame 2, the winding of superconducting wire 4 is completed, and coil group C is formed, spacer 3 only needs to be exposed to an environment of about 120° C. for about 30 minutes to be cured. Spacer 3 may be cured every time the winding of one layer of superconducting wire 4 is completed. In this way, strength of spacer 3 can be secured. Winding groove 5 and communication groove 6 in which superconducting wire 4 is wound may be sealed with an insulating resin such as an epoxy resin. In this way, deformation of superconducting wire 4 due to an action of an electromagnetic force can be suppressed, and strength of superconducting coil 1 can be secured.

An example has been described in which the depths of the grooves of winding groove 5 and communication groove 6 are set to be substantially the same as those of superconducting wire 4. However, the depths of the grooves of winding groove 5 and communication groove 6 may be set to be small as long as superconducting wire 4 can be disposed.

Figure 4:
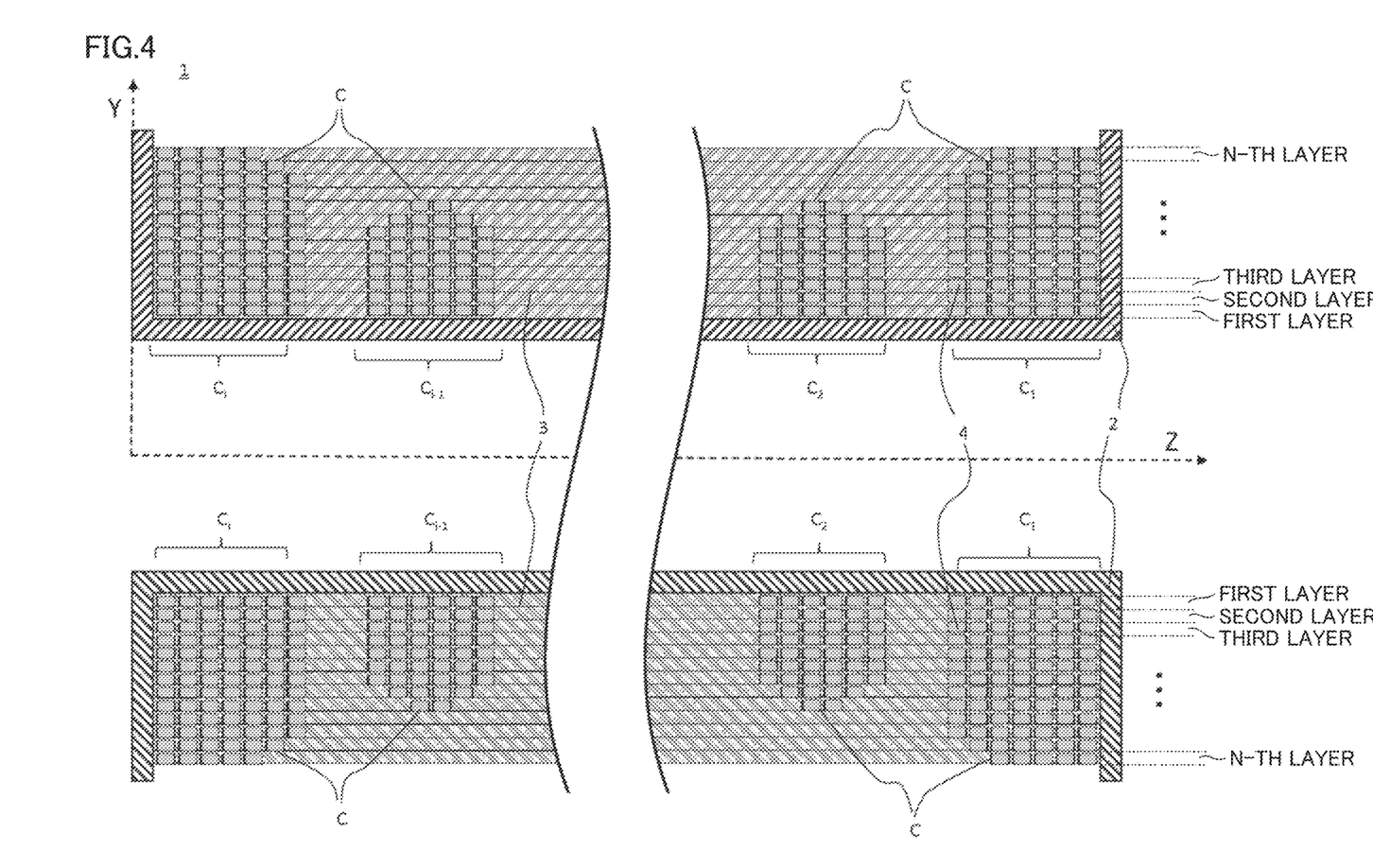
FIG. 4 is a schematic sectional view of the superconducting coil according to the first embodiment.

In the present embodiment, an example has been described in which two coil groups C are provided in spacer 3, but the number of coil groups C is not limited. In this case, winding grooves 5 only needs to be provided such that a desired number (i) of coil groups C can be disposed. Communication grooves 6 only needs to be provided corresponding to the number of winding grooves 5. In a case where three or more coil groups C are provided in spacer 3, as illustrated in FIG. 4, superconducting wire 4 is wound to form a single layer of coil group C, and in each layer, superconducting wire 4 is extended to the upper layer to provide i coil groups $C_1$ to $C_i$. Here, i is an integer greater than 1. In this case, by forming coil groups C symmetrically at the center of winding frame 2, magnetic field uniformity is improved.

Second Embodiment

Figure 5:
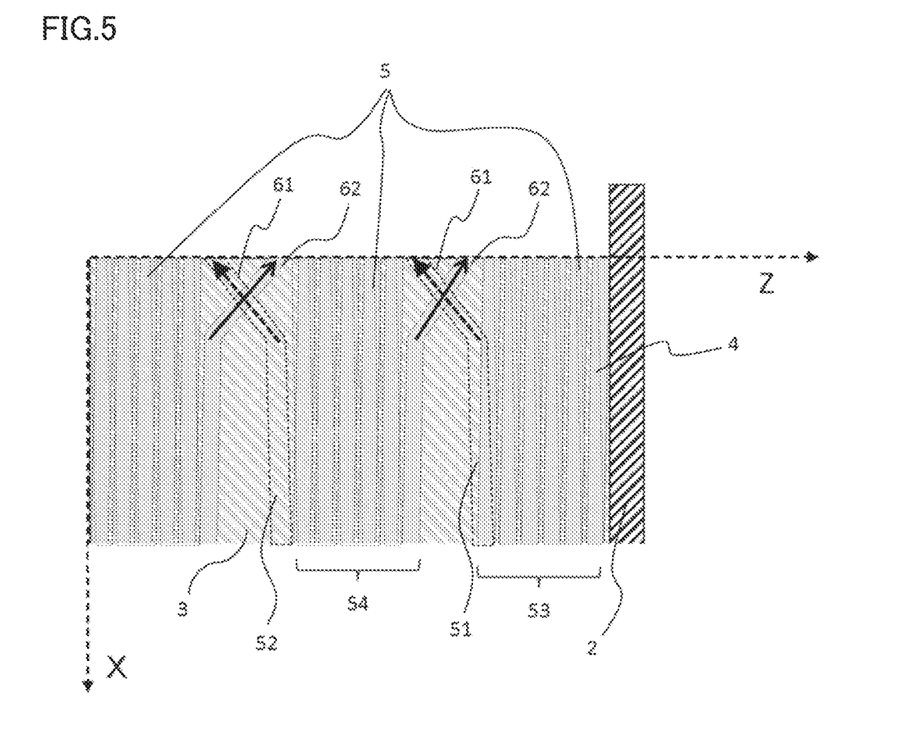
FIG. 5 is a top view illustrating a part of a superconducting coil according to a second embodiment.

FIG. 5 is a schematic top view illustrating a part of spacer 3 of superconducting coil 1 according to a second embodiment. As in the first embodiment, superconducting coil 1 according to the present embodiment includes coil group C in which spacer 3 having winding groove 5 and communication groove 6 is disposed on winding frame 2, and superconducting wire 4 is wound in winding groove 5. Further, in the present embodiment, communication groove 6 of spacer 3 disposed in the upper layer intersects communication groove 6 of spacer 3 disposed in the lower layer in top view. The same components as those in the first embodiment are denoted by the same reference signs, and the description thereof will be omitted.

In spacer 3 in FIG. 5, second spacer 32 in the upper layer is disposed on first spacer 31 in the lower layer, and first spacer 31 is seen through from second spacer 32. First communication groove 61 of first spacer 31 indicated by a broken line in FIG. 5 and second communication groove 62 of second spacer 32 indicated by a solid line are disposed so as to intersect each other.

A broken line arrow in FIG. 5 indicates a direction of a current flowing through superconducting wire 4 disposed in first communication groove 61, and a solid line arrow indicates a direction of a current flowing through superconducting wire 4 disposed in second communication groove 62. Since coil group C is formed by folding superconducting wire 4 in each layer, directions in which superconducting wire 4 is wound in communication groove 6 are opposite between adjacent layers. In an example in FIG. 5, when superconducting wire 4 is wound in a direction from first winding groove 51 toward second winding groove 52 in the first layer, superconducting wire 4 is wound in a direction from fourth winding groove 54 toward third winding groove 53 in the second layer.

Therefore, when the direction in which superconducting wire 4 is wound is opposite between adjacent layers, the direction of the flowing current can also be opposite between adjacent layers. Accordingly, when communication grooves 6 cross each other between adjacent layers, a magnetic field component orthogonal to the Z axis in FIG. 5 is canceled, and generation of an unnecessary magnetic field component can be suppressed.

Alternatively, first communication groove 61 and second communication groove 62 may overlap each other in an identical direction in top view. Similarly, since the currents flowing through communication grooves 6 between adjacent layers are opposite to each other, the magnetic field component orthogonal to the Z axis can be canceled, and generation of an unnecessary magnetic field component can be suppressed.

As described above, when vertically adjacent first spacer 31 and second spacer 32 included in first communication groove 61 and second communication groove 62, respectively, are disposed so as to intersect each other or overlap each other in the same direction in top view, the directions of currents flowing through superconducting wires 4 disposed in first communication groove 61 and second communication groove 62 are opposite to each other, and uniformity of a magnetic field generated by superconducting coil 1 is improved.

First communication groove 61 and second communication groove 62 are preferably disposed substantially symmetrically in top view. In this way, a magnetic field component orthogonal to the Z axis can be suppressed by a magnetic field component generated in superconducting wire 4 disposed in first communication groove 61 and a magnetic field component generated in superconducting wire 4 disposed in second communication groove 62.

In the present embodiment, an example has been described in which first communication groove 61 and second communication groove 62 intersect each other. The same applies to a case where another spacer 3 is disposed in the lower layer of first spacer 31 or in the upper layer of second spacer 32. Communication groove 6 in the upper layer and communication groove 6 in the lower layer only need to intersect each other or overlap each other in parallel in top view.

Third Embodiment

Figure 6:
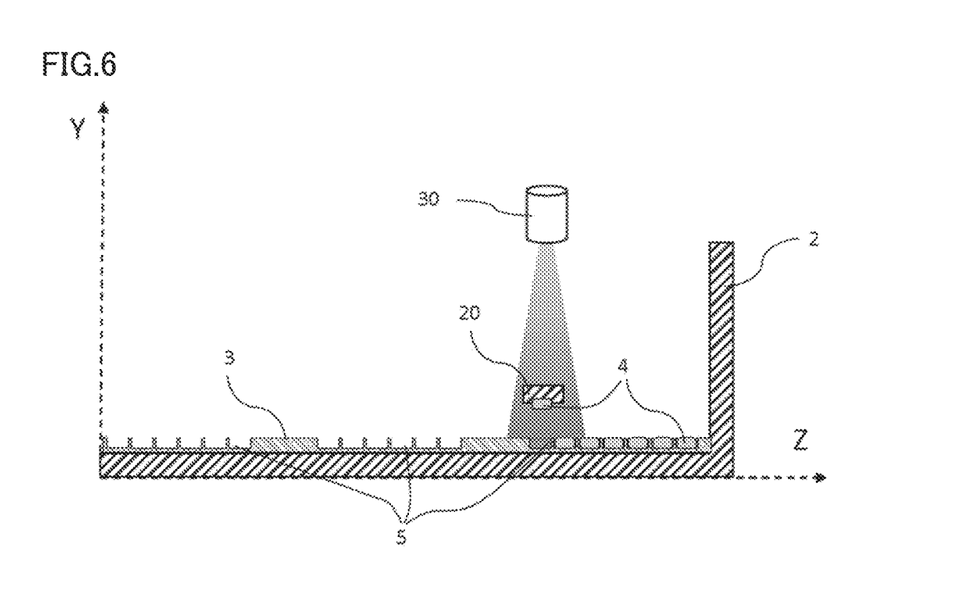
FIG. 6 is an explanatory view for describing a manufacturing method for a superconducting coil according to a third embodiment.

FIG. 6 is an explanatory view for describing a manufacturing method for superconducting coil 1 according to a third embodiment. As in the first embodiment, the manufacturing method for superconducting coil 1 according to the present embodiment includes arranging, on winding frame 2, spacer 3 having winding groove 5 and communication groove 6 communicating with adjacent winding groove 5, and winding superconducting wire 4 in winding groove 5 and communication groove 6 and forming a single layer of coil group C. The present embodiment is different from the first embodiment in that superconducting wire 4 is automatically wound in winding groove 5 and communication groove 6 to form coil group C. The same components as those in the first embodiment are denoted by the same reference signs, and the description thereof will be omitted.

In the present embodiment, superconducting wire 4 is wound in spacer 3 using a winding guide 20 and a position detector 30 to form coil group C. Winding guide 20 around which superconducting wire 4 is wound is disposed so as to be movable in a horizontal direction (Z axis direction in FIG. 6) on the outer periphery of winding frame 2. A position and orientation of winding guide 20 are controlled on the basis of position information of winding groove 5 and communication groove 6 of spacer 3 measured by position detector 30.

Position detector 30 includes a laser displacement meter, an image measurement device, and the like. In a case where a laser displacement meter is used for position detector 30, the displacement can be acquired by measuring heights of bottoms and peaks between the grooves of winding groove 5 and communication groove 6 of spacer 3. When an image measurement device such as a CCD camera is used as position detector 30, positions of winding groove 5 and communication groove 6 can be acquired by automatically focusing focal positions of the bottoms and the peaks between the grooves of winding groove 5 and communication groove 6 of the spacer 3. The position information such as the displacement, the positions of winding groove 5 and communication groove 6 is transmitted to a control device (not shown). Further, by using the position information, the control device performs control to arrange winding guide 20 on the grooves of winding groove 5 and communication groove 6.

Winding frame 2 is provided in a rotating device (not shown) so as to be rotatable about the Z axis as a rotation center. When spacer 3 is provided on winding frame 2 and spacer 3 is rotated together with winding frame 2, superconducting wire 4 can be wound from winding guide 20 and disposed in winding groove 5 and communication groove 6.

Winding guide 20 is controlled to be disposed on the grooves of winding groove 5 and communication groove 6 detected by position detector 30, winding frame 2 is rotated, winding guide 20 is sequentially moved on the grooves where superconducting wire 4 is not disposed, and a single layer of coil group C is automatically wound. After the single layer of coil group C is formed, spacer 3 is newly disposed, and a single layer of coil group C is similarly formed. By repeating the above processing, coil group C can be automatically wound and formed on the basis of the design of winding groove 5 and communication groove 6.

In this way, by forming coil groups C of a plurality of layers on the basis of the design of winding groove 5 and communication groove 6, superconducting wire 4 can be accurately wound using the position information, and the coil shape can be made as desired. Furthermore, since coil group C can be automatically wound, the production efficiency is improved.

In the present embodiment, a laser displacement meter may be used as position detector 30 to detect the bottoms between the grooves of winding groove 5 and communication groove 6 while slightly vibrating the laser displacement meter in the Z axis direction. This improves accuracy of the position information of winding groove 5 and communication groove 6 acquired by position detector 30.

REFERENCE SIGNS LIST

1: superconducting coil, 2: winding frame, 3: spacer, 4: superconducting wire, 5: winding groove, 6: communication groove, 7: space, 20: winding guide, 30: position detector, 31: first spacer, 32: second spacer, 51: first winding groove, 52: second winding groove, 53: third winding groove, 54: fourth winding groove, 61: first communication groove, 62: second communication groove, C, $C_i$: coil group

The invention claimed is:

1. A superconducting coil comprising:
 a winding frame;
 a first spacer disposed on an outer periphery of the winding frame and including
 a first winding groove having a spiral shape and disposed in a peripheral direction of the winding frame,
 a second winding groove having a spiral shape and disposed apart from the first winding groove, and
 a first communication groove provided between the first winding groove and the second winding groove;
 a second spacer disposed on an upper layer of the first spacer and including
 a third winding groove having a spiral shape and disposed above the first winding groove,
 a fourth winding groove having a spiral shape and disposed apart from the third winding groove and above the second winding groove, and
 a second communication groove provided between the third winding groove and the fourth winding groove;
 a first coil group including
 a first layer of a superconducting wire having the superconducting wire wound in the first winding groove, and
 a second layer of the superconducting wire having the superconducting wire wound in the third winding groove; and
 a second coil group communicated with the first coil group by the superconducting wire on the first communication groove and the second communication groove and including
 a first layer of the superconducting wire having the superconducting wire wound in the second winding groove, and
 a second layer of the superconducting wire having the superconducting wire wound in the fourth winding groove.

2. The superconducting coil according to claim 1, wherein
a plurality of spacers each including winding grooves disposed in the peripheral direction of a plurality of the winding frames and having a spiral shape and a communication groove to communicate adjacent winding grooves of the winding grooves with each other are disposed in at least one of a lower layer of the first spacer and an upper layer of the second spacer, and
each of the winding grooves is provided with a coil group in which the superconducting wire is wound.

3. The superconducting coil according to claim 1, wherein a number of grooves of the first winding groove is different from a number of grooves of the third winding groove in sectional view.

4. The superconducting coil according to claim 1, wherein the first winding groove includes a part having different distances between the grooves.

5. The superconducting coil according to claim 1, wherein the first communication groove and the second communication groove intersect each other or overlap each other in an identical direction.

6. The superconducting coil according to claim 1, wherein at least one of the first winding groove and the first communication groove is sealed with an insulating resin.

7. A manufacturing method for a superconducting coil comprising:
a first spacer arrangement step of arranging, on an outer periphery of a winding frame, a first spacer including
a first winding groove having a spiral shape and disposed on the outer periphery of the winding frame,
a second winding groove having a spiral shape and disposed apart from the first winding groove, and
a first communication groove to communicate the first winding groove with the second winding groove;
a first layer formation step of forming a first layer of a first coil group by winding a superconducting wire in the first winding groove and
forming a first layer of a second coil group by winding the superconducting wire in the first communication groove and the second winding groove;
a second spacer arrangement step of arranging, on the first spacer, a second spacer including a third winding groove disposed on the first spacer and having a spiral shape, a fourth winding groove disposed apart from the third winding groove and having a spiral shape, and a second communication groove communicating the third winding groove with the fourth winding groove such that the third winding groove is disposed above the first winding groove, and the fourth winding groove is disposed above the second winding groove; and
a second layer formation step of forming a second layer of the second coil group by winding the superconducting wire in the fourth winding groove and
forming a second layer of the first coil group by winding the superconducting wire in the second communication groove and the third winding groove.

8. The manufacturing method for a superconducting coil according to claim 7, the manufacturing method comprising:
forming a plurality of spacers having a plurality of winding grooves disposed on the outer periphery of the winding frame and having a spiral shape and a plurality of communication grooves to communicate adjacent winding grooves of the plurality of winding grooves with each other;
arranging the spacers on the outer periphery of the winding frame;
forming a single layer of a coil group being continuous and including a single layer of the first coil group and a single layer of the second coil group by winding the superconducting wire in the winding grooves and the communication grooves; and
arranging the spacers on an upper layer of the single layer of the coil group having been formed and extending the superconducting wire constituting the single layer of the coil group to the spacers disposed on the upper layer,
wherein a plurality of layers of the coil group are formed by repeating arranging of one of the spacers, forming of the single layer of the coil group being continuous, and extending of the superconducting wire constituting the single layer of the coil group to the spacers disposed in the upper layer.

9. The manufacturing method for a superconducting coil according to claim 7, wherein
in the first spacer arrangement step, the first spacer is softened by heating and disposed on the outer periphery of the winding frame, the first spacer being formed by molding the first winding groove, the second winding groove, and the first communication groove in a prepreg sheet in which reinforcing fibers are impregnated with an epoxy resin,
in the second spacer arrangement step, the second spacer is softened by heating and disposed on the first spacer, the second spacer being formed by molding the third winding groove, the fourth winding groove, and the second communication groove in a prepreg sheet in which reinforcing fibers are impregnated with an epoxy resin, and
the manufacturing method further includes curing the first spacer and the second spacer after forming the first coil group and the second coil group.

10. The manufacturing method for a superconducting coil according to claim 7, wherein
in the first layer formation step, positions of the first winding groove, the second winding groove, and the first communication groove are detected by a position detector,
a winding guide around which the superconducting wire is wound is moved to the positions detected by the position detector,
the winding frame is rotated to arrange the superconducting wire of the winding guide at the positions of the first winding groove, the second winding groove, and the first communication groove, and
the first layer of the first coil group and the first layer of the second coil group are formed, and
in the second layer formation step, positions of the third winding groove, the fourth winding groove, and the second communication groove are detected by the position detector,
the winding guide around which the superconducting wire is wound is moved to the positions detected by the position detector,
the winding frame is rotated to arrange the superconducting wire of the winding guide at the positions of the third winding groove, the fourth winding groove, and the second communication groove, and
the second layer of the first coil group and the second layer of the second coil group are formed.

* * * * *